United States Patent

(12) United States Patent
McClymont (10) Patent No.: US 9,981,317 B2
(45) Date of Patent: May 29, 2018

(54) POLYCRYSTALLINE CHEMICAL VAPOUR DEPOSITED DIAMOND TOOL PARTS AND METHODS OF FABRICATING, MOUNTING, AND USING THE SAME

(71) Applicant: Element Six Technologies Limited, Oxfordshire (GB)

(72) Inventor: Mark McClymont, Berkshire (GB)

(73) Assignee: Element Six Technologies Limited (GB)

( * ) Notice: Subject to any disclaimer, the term of this patent is extended or adjusted under 35 U.S.C. 154(b) by 18 days.

(21) Appl. No.: 15/033,669

(22) PCT Filed: Nov. 20, 2014

(86) PCT No.: PCT/EP2014/075137
§ 371 (c)(1),
(2) Date: May 2, 2016

(87) PCT Pub. No.: WO2015/075120
PCT Pub. Date: May 28, 2015

(65) Prior Publication Data
US 2016/0250691 A1 Sep. 1, 2016

Related U.S. Application Data

(60) Provisional application No. 61/907,513, filed on Nov. 22, 2013.

(30) Foreign Application Priority Data

Dec. 23, 2013 (GB) .................................. 1322837.4

(51) Int. Cl.
*B23B 27/00* (2006.01)
*B23B 27/20* (2006.01)
(Continued)

(52) U.S. Cl.
CPC .............. *B23B 27/20* (2013.01); *C23C 16/01* (2013.01); *C23C 16/27* (2013.01); *C23C 16/279* (2013.01);
(Continued)

(58) Field of Classification Search
USPC ........... 51/307, 309; 428/212, 325, 336, 408
See application file for complete search history.

(56) References Cited

U.S. PATENT DOCUMENTS 5,139,372 A   8/1992  Tanabe et al.
5,366,522 A   11/1994 Nakamura et al.
(Continued)

FOREIGN PATENT DOCUMENTS

DE   202004014495   * 11/2005
GB      2497662 A     6/2013
(Continued)

OTHER PUBLICATIONS

May et al. "785 nm Raman spectroscopy of CVD diamond films", Diamond & Related Materials 17 (2008) 199-203.
(Continued)

*Primary Examiner* — Archene Turner
(74) *Attorney, Agent, or Firm* — Bryan Cave Leighton Paisner LLP (57) ABSTRACT

A polycrystalline CVD synthetic diamond work piece for use in a polycrystalline CVD synthetic diamond tool, the polycrystalline CVD synthetic diamond work piece comprising:
  a working surface;
  and a rear mounting surface;
  wherein an average lateral grain size of the rear mounting surface is no less than 10 μm, and
  wherein the working surface comprises:
    (a) smaller diamond grains than the rear mounting surface;
(Continued)

(b) an average lateral grain size in a range 10 nm to 15 μm; and
(c) a Raman signal generated by a laser focused on the working surface which exhibits one or more of the following characteristics:
  (1) an sp3 carbon peak at 1332 cm$^{-1}$ having a full width half-maximum of no more than 8.0 cm$^{-1}$,
  (2) an sp2 carbon peak at 1550 cm$^{-1}$ having a height which is no more than 20% of a height of an sp3 carbon peak at 1332 cm$^{-1}$ after background subtraction when using a Raman excitation source at 633 nm; and
  (3) an sp3 carbon peak at 1332 cm$^{-1}$ is no less than 10% of local background intensity in a Raman spectrum using a Raman excitation source at 785 nm.

14 Claims, 3 Drawing Sheets

(51) Int. Cl.
  *C23C 16/01* (2006.01)
  *C23C 16/27* (2006.01)
  *C30B 29/04* (2006.01)
(52) U.S. Cl.
  CPC ........ *C30B 29/04* (2013.01); *B23B 2226/315* (2013.01); *B23B 2228/04* (2013.01)

(56) References Cited

U.S. PATENT DOCUMENTS

| | | | |
|---|---|---|---|
| 5,435,815 A * | 7/1995 | Ikegaya | B23P 15/28 51/309 |
| 5,851,658 A * | 12/1998 | Yamamoto | C23C 16/274 428/408 |
| 5,989,511 A * | 11/1999 | Gruen | C23C 14/0605 423/446 |
| 6,319,610 B1 * | 11/2001 | Zimmer | B24D 3/06 428/141 |
| 2006/0216515 A1 | 9/2006 | Kazahaya et al. | |

FOREIGN PATENT DOCUMENTS

| | | | |
|---|---|---|---|
| GB | 2501603 A | | 10/2013 |
| JP | 62107068 A | | 5/1987 |
| JP | 042233807 | | 8/1992 |
| JP | 05-148089 | * | 6/1993 |
| JP | 0679504 | | 3/1994 |
| JP | 2004131336 A | | 4/2004 |
| JP | 2012-176471 | * | 9/2012 |
| WO | 2005/011902 | | 10/2005 |
| WO | 2005110648 A2 | | 11/2005 |
| WO | 2008090511 A1 | | 7/2008 |

OTHER PUBLICATIONS

Hu et al. "Characterizations of nano-crystalline diamond coating cutting tools", Surface & Coatings Technology 202 (2007) 1113-1117.
International Search Report for PCT/EP2014/075137 dated Feb. 19, 2015.
Search Report for GB1322837.4 dated Jun. 24, 2014.
Search Report for GB1420623.9 dated May 18, 2015.
Kuang Tongchun et al, "Applications of laser Raman Spectroscopy in characterizing the quality of CVD Diamond Films," Dec. 31, 1997, p. 21-25, vol. 33 No. 7.

* cited by examiner

POLYCRYSTALLINE CHEMICAL VAPOUR DEPOSITED DIAMOND TOOL PARTS AND METHODS OF FABRICATING, MOUNTING, AND USING THE SAME

FIELD OF INVENTION

Certain embodiments of the invention relate to polycrystalline chemical vapour deposited (CVD) diamond tool parts. Certain further embodiments of the present invention relate to methods of fabricating polycrystalline CVD diamond work pieces, mounting said polycrystalline CVD diamond work pieces in a holder to form a polycrystalline CVD diamond tool part, and using said polycrystalline CVD diamond tool parts.

BACKGROUND OF INVENTION

For any application a user must consider a number of factors when choosing a tool material. Such factors including: cost; toughness; wear rate/hardness; ability to process a desired working surface such as a cutting edge; useful lifetime; required size and geometry; and inertness to chemical effects with the material to be processed.

An ideal tool material is one which is both hard and tough. These two properties of materials used in wear and tear applications are often presented on two perpendicular axes. Very simply, wear is a measurement of the amount of material removed per unit of operation. Toughness is a measure of a material's resistance to crack propagation. There is an on-going desire to provide materials which are harder, tougher, stronger and more wear resistant.

Diamond materials are the materials of choice for many premium performance cutting, drilling, grinding and polishing tools. Diamond materials are used in tooling solutions across a range of industries including a variety of metal, stone, electronics, and woodworking industries. Examples include aerospace and automotive manufacturing, furniture production, stone quarrying, construction, mining and tunnelling, mineral processing, electronic component and device fabrication, and the oil and gas industries. Examples of diamond tool parts include: wear parts; dressers; wire drawing dies; gauge stones; and cutters such as blades or other parts comprising a cutting edge.

Diamond's hardness properties make it the ultimate material in terms of wear. However, diamond's limited ability to plastically deform under stress at the tool's working temperature leads to more rapid crack propagation in comparison to much tougher materials such as steel. Previous attempts to improve the durability of diamond have involved either adapting the method of forming the diamond material, e.g. by varying nitrogen content, or treating the diamond material after forming the material, e.g. by irradiation and/or annealing. It has been found that such approaches can be used to improve the toughness and/or wear resistance of diamond tools.

Diamond tools usually comprise a diamond work piece mounted in a holder which may be fabricated, for example, using a metal material. The diamond work piece may be fabricated using a single crystal of natural, CVD synthetic, or HPHT (high pressure high temperature) synthetic diamond material. Alternatively, the diamond work piece may comprise a plurality of diamond grains bonded via a matrix of binder material, e.g. silicon cemented diamond, or via diamond-to-diamond bonding using a metal solvent, e.g. PCD (HPHT polycrystalline diamond) formed using a cobalt metal solvent, the latter usually containing residual metal solvent material although this can be leached out of the material after synthesis to a varying extent. Alternatively still, the diamond work piece may be fabricated using polycrystalline CVD synthetic diamond material which comprises a plurality of diamond grains directly bonded together via diamond-to-diamond bonding as a result of the CVD growth method, without the use of any metal solvent.

The aforementioned diamond materials have different physical characteristics and the type of diamond material used for a particular application will depend on the characteristics required for the application.

While many applications require a diamond material which has improved toughness and/or wear resistance as previously described, certain diamond tool applications require the ability to provide a very fine surface finish on the material being processed by the diamond tool. For example, metal device packaging for electronic devices may require a very fine surface finish for cosmetic purposes. Such applications also require a diamond tool part which has a working surface with certain minimum dimensions.

It is an aim of embodiments of the present invention to provide diamond tool parts which are capable of providing a very fine surface finish while also providing a working surface with sufficiently large dimensions as required for certain commercial applications.

SUMMARY OF INVENTION

The present inventors have performed an experimental study which has shown that polycrystalline CVD diamond materials offer surface finish benefits over conventional HPHT fabricated PCD tools. The present inventors have also found that polycrystalline CVD diamond materials do not offer the same level of finish as single crystal diamond tools which are capable of generating a very high quality surface finish. However, at the time of writing, high specification single crystal CVD diamond materials are only available in relatively small sizes and, to the extent that they are available in larger sizes these are relatively rare and expensive with costs rising quickly with single crystal diamond edge length. Furthermore, for certain applications requiring a very fine surface finish, a larger working surface is required than that which is readily available, or available at all, in single crystal diamond form. While polycrystalline CVD diamond tool pieces are available in much larger sizes, it has been found that this material does not achieve the desired very fine surface finish for certain applications.

As such, a problem exists in that currently available diamond tools do not provide the combination of fine surface finish and dimensional size requirements for certain applications. That is, a long edge length tool capable of generating surface finishes typically associated with single crystal diamond tools, and which is available in volume at reasonable cost, is required to access some machining markets.

In light of the above, the present inventors have studied the mechanisms responsible for polycrystalline CVD diamond materials not giving the same level of finish provided by single crystal diamond tools. It has been concluded that a number of factors may contribute to a degradation in the surface finish provided by a polycrystalline CVD diamond tool when compared to a single crystal diamond tool including:

(i) diamond grains at the working surface of the polycrystalline CVD diamond tool can chip out during use leading to degradation in the integrity of the working surface resulting in scratching or grooving of the material being processed by the polycrystalline CVD diamond tool; and (ii) even prior to use of the polycrystalline CVD diamond tool, the quality of the working surface in terms of providing a precise, smooth edge and adjacent leading surface is lower than that achievable in a single crystal diamond tool due to the granular and non-uniform nature of the polycrystalline CVD diamond material when compared to single crystal diamond material.

In relation to the above, it has been further noted by the present inventors that polycrystalline CVD diamond tools are usually configured such that a growth face, rather than a nucleation face, of the polycrystalline CVD diamond material forms the exposed working surface of the tool. This is because the growth face is usually formed of better quality, more inter-grown grains of diamond material with a lower concentration of non-diamond sp2 carbon when compared to the nucleation face. As such, the growth face has been found to have a lower wear rate when compared to the nucleation face of the polycrystalline CVD diamond material.

In this regard, it should be noted that a wafer of polycrystalline CVD diamond material usually comprises: a nucleation face which comprises small grains of diamond material and significant quantities of non-diamond sp2 carbon (detectable via Raman spectroscopy); and a growth face, which comprises larger grains of diamond material and, if growth conditions are controlled correctly, a lower quantity of non-diamond sp2 carbon. Diamond grain size increases on moving through such a wafer of polycrystalline CVD diamond material from the nucleation face to the growth face.

The present inventors have postulated that if the smaller grained nucleation face of the polycrystalline CVD diamond material, rather than the growth face, is utilized as the working surface of a diamond tool then the smaller grained microstructure of the nucleation face may alleviate problems of large grains chipping out during use leading to visually perceptible scratching or grooving of the material being processed. The present inventors have further postulated that even prior to use, if the smaller grained nucleation face of the polycrystalline CVD diamond material is utilized as the working surface of a diamond tool then the quality of the working surface that is achievable in terms of providing a precise, smooth edge and adjacent leading surface will be increased when compared to a working surface formed of a growth face having a larger grained structure. That is, in terms of providing a fine surface finish, the nucleation face of a polycrystalline CVD diamond material may approach the quality of surface finish achievable using single crystal diamond tools while at the same time being available in much larger sizes and at reduced costs to meet the requirements of commercial applications which require such a combination of features.

However, one problem with the above approach is that the quality of the diamond material at the nucleation face of a polycrystalline CVD diamond material is poor and generally has significant quantities of sp2 carbon and a low wear resistance which is insufficient for industrial applications which require long tool operating lifetimes, particularly given the high cost of diamond materials and tool parts. In addition, the high wear rate of the poor quality nucleation face of the polycrystalline CVD diamond material can lead to a relatively rapid change in the quality of surface finishing which is achieved during use.

In light of the above, the present inventors have determined that if a controlled portion of lower quality diamond material is removed from the nucleation face of a polycrystalline CVD diamond wafer it is possible to achieve a surface which has a desired grain size and which also has low sp2 carbon content with a high wear resistance approaching that of the growth face. If such a surface is then mounted in a holder such that it forms the working surface of a diamond tool it is possible to provide a diamond tool which has a unique combination of characteristics including:

the ability to achieve high quality surface finishing due to a precisely defined working surfaces comprising small grains of diamond material;

the provision of a large working surface due to the availability of large polycrystalline CVD diamond wafers from which the diamond tool can be fabricated;

the provision of a working surface having a low wear rate due to removal of poor quality nucleation diamond material from the nucleation face of the polycrystalline CVD diamond wafer from which the working surface of the diamond tool is fabricated; and a relatively low cost when compared with alternative large single crystal diamond materials to the extent that the required sizes of large single crystal diamond materials are available at all.

In light of the above, there is provided a polycrystalline CVD synthetic diamond work piece for use in a polycrystalline CVD synthetic diamond tool, the polycrystalline CVD synthetic diamond work piece comprising:

a working surface;

and a rear mounting surface;

wherein an average lateral grain size of the rear mounting surface is no less than 10 µm, and wherein the working surface comprises:
(a) smaller diamond grains than the rear mounting surface;
(b) an average lateral grain size in a range 10 nm to 15 µm; and
(c) a Raman signal generated by a laser focused on the working surface which exhibits one or more of the following characteristics:
(1) an sp3 carbon peak at 1332 cm$^{-1}$ having a full width half-maximum of no more than 8.0 cm$^{-1}$,
(2) an sp2 carbon peak at 1550 cm$^{-1}$ having a height which is no more than 20% of a height of an sp3 carbon peak at 1332 cm$^{-1}$ after background subtraction when using a Raman excitation source at 633 nm; and
(3) an sp3 carbon peak at 1332 cm$^{-1}$ is no less than 10% of local background intensity in a Raman spectrum using a Raman excitation source at 785 nm.

Also described herein is a polycrystalline CVD synthetic diamond tool comprising:

a polycrystalline CVD synthetic diamond work piece as described herein; and a holder to which the polycrystalline CVD synthetic diamond work piece is mounted, wherein the polycrystalline CVD synthetic diamond work piece is oriented such that the working surface of the polycrystalline CVD synthetic diamond work piece is exposed to form a working surface of the polycrystalline CVD synthetic diamond tool.

There is also provided a method of processing a material using a polycrystalline CVD synthetic diamond tool as described herein, the method comprising:

orienting the polycrystalline CVD synthetic diamond tool such that the working surface thereof is in contact with the material to be processed; and processing the material by providing relative movement of the material and the working surface of the polycrystalline CVD synthetic diamond tool while the working surface of the polycrystalline CVD synthetic diamond tool is in contact with the material being processed.

A method of fabricating a plurality of polycrystalline CVD synthetic diamond work pieces is described, the method comprising:
  starting with a layer of polycrystalline CVD synthetic diamond material having a nucleation face and a growth face, the nucleation face comprising smaller grains than the growth face, wherein the average lateral grain size of the growth face is no less than 10 μm;
  processing the nucleation face of the layer of polycrystalline CVD synthetic diamond material to remove a portion of the polycrystalline CVD synthetic diamond material from the nucleation face, said portion having a depth of between 50 nm and 30 μm, to form a processed nucleation surface which has:
    (a) smaller diamond grains than the growth face;
    (b) an average lateral grain size in a range 10 nm to 15 μm; and
    (c) a Raman signal generated by a laser focused on the processed nucleation surface which exhibits one or more of the following characteristics:
      (1) an sp3 carbon peak at 1332 cm$^{-1}$ having a full width half-maximum of no more than 8.0 cm$^{-1}$,
      (2) an sp2 carbon peak at 1550 cm$^{-1}$ having a height which is no more than 20% of a height of an sp3 carbon peak at 1332 cm$^{-1}$ after background subtraction when using a Raman excitation source at 633 nm; and
      (3) an sp3 carbon peak at 1332 cm$^{-1}$ is no less than 10% of local background intensity in a Raman spectrum using a Raman excitation source at 785 nm, and
  cutting the layer of polycrystalline CVD synthetic diamond material to form a plurality of polycrystalline CVD synthetic diamond work pieces such that a working surface of each of the polycrystalline CVD synthetic diamond work pieces is formed of said processed nucleation surface.

Also described herein is another method of fabricating a plurality of polycrystalline CVD synthetic diamond work pieces, the method comprising:
  growing a layer of polycrystalline CVD synthetic diamond material on a growth substrate, the layer of polycrystalline CVD synthetic diamond material having a nucleation face and a growth face, the nucleation face comprising smaller grains than the growth face, wherein the average lateral grain size of the growth face is no less than 10 μm;
  wherein the growth substrate has a surface flatness≤5 μm as measured over a length of 5 mm across the growth substrate and a surface roughness $R_a$≤20 nm;
  wherein growth of the polycrystalline CVD synthetic diamond material is controlled such that after removal of the growth substrate the nucleation face of the layer of polycrystalline CVD synthetic diamond material has:
    (a) smaller diamond grains than the growth face;
    (b) an average lateral grain size in a range 10 nm to 15 μm; and
    (c) a Raman signal generated by a laser focused on the processed nucleation surface which exhibits one or more of the following characteristics:
      (1) an sp3 carbon peak at 1332 cm$^{-1}$ having a full width half-maximum of no more than 8.0 cm$^{-1}$,
      (2) an sp2 carbon peak at 1550 cm$^{-1}$ having a height which is no more than 20% of a height of an sp3 carbon peak at 1332 cm$^{-1}$ after background subtraction when using a Raman excitation source at 633 nm; and
      (3) an sp3 carbon peak at 1332 cm$^{-1}$ is no less than 10% of local background intensity in a Raman spectrum using a Raman excitation source at 785 nm, and
  cutting the layer of polycrystalline CVD synthetic diamond material to form a plurality of polycrystalline CVD synthetic diamond work pieces such that a working surface of each of the polycrystalline CVD synthetic diamond work pieces is formed of said nucleation face.

BRIEF DESCRIPTION OF THE DRAWINGS

For a better understanding of the present invention and to show how the same may be carried into effect, embodiments of the present invention will now be described by way of example only with reference to the accompanying drawings, in which.

DETAILED DESCRIPTION OF CERTAIN EMBODIMENTS

Figure 1:
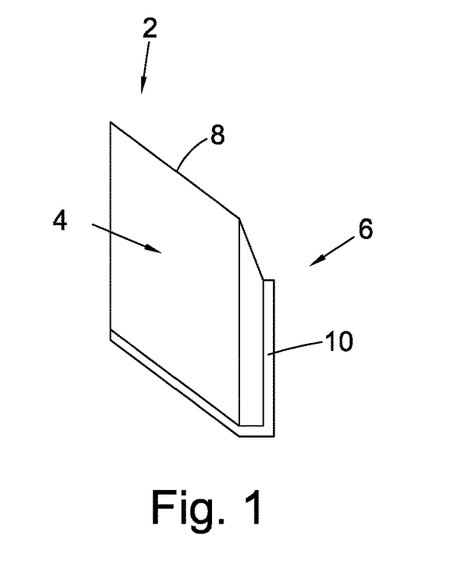
FIG. 1 illustrates a polycrystalline CVD synthetic diamond work piece.

FIG. 1 illustrates a polycrystalline CVD synthetic diamond work piece 2 according to an embodiment of the present invention. The polycrystalline CVD synthetic diamond work piece 2 comprises a working surface 4, a rear mounting surface 6, and a cutting edge 8 with the working surface 4 extending from the cutting edge 8. A metallization coating 10 may be bonded to the rear mounting surface 6 such that the polycrystalline CVD synthetic diamond work piece 2 can be readily mounted to a holder by, for example, a metal braze bond.

The working surface 4 comprises smaller diamond grain than the rear mounting surface 6. This is indicative of the working surface 4 having been formed from a processed nucleation face of the as-grown polycrystalline CVD synthetic diamond material with the rear mounting surface 6 having been formed of a processed growth face of the polycrystalline CVD synthetic diamond as described later. An average lateral grain size of the working surface 4 is in a range 10 nm to 15 μm while an average lateral grain size of the rear mounting surface 6 is no less than 10 μm.

In this regard, the working surface 4 has a small, controlled, and well defined grain size which is suitable for achieving a fine surface finish in use. In contrast, the rear mounting surface 6 has a large, well inter-grown diamond grain structure providing mechanical support for the working surface 4.

The exact average lateral grain size for the working surface 4 and the rear mounting surface 6 will depending on the particular application including the type of material to be processed and the desired surface finish required. For example, the average lateral grain size of the working surface 4 may be no less than 20 nm, 40 nm, 60 nm, 80 nm, 100 nm, 500 nm, 1 µm, 2 µm, or 5 µm, and/or no more than 12 µm, 10 µm, 8 µm, 6 µm, 4 µm, or 2 µm, and/or any combination of the aforementioned upper and lower limits. Furthermore, the average lateral grain size of the rear mounting surface may be no less than 12 µm, 14 µm, 16 µm, 18 µm, 20 m, 30 µm, 40 µm, or 50 µm.

In relation to the above, an average lateral grain size of a polycrystalline CVD diamond surface can be measured using scanning electron microscopy (SEM). SEM images of a surface of a polycrystalline CVD diamond material indicate boundaries between grains such that individual grains can be identified and counted. Accordingly, an area of the polycrystalline CVD diamond surface can be imaged using SEM, the total number of diamond grains along a line across the image can then be counted, and then the line length can be divided by the number of grains along the line to obtain and an average lateral grain size. A number of lines across the SEM image can be analysed in this manner, optionally in perpendicular directions, and an average value calculated for the lateral grain size across the imaged area.

In addition to selecting a suitable grain size structure for the working surface 4 and the rear mounting surface 6 as describe above, it is also important to ensure that the working surface 4 is formed of good quality diamond material with a low sp2 carbon content. As described in the summary of invention section of this specification, the quality of the diamond material at the nucleation face of a polycrystalline CVD diamond material is poor and generally has significant quantities of sp2 carbon and a low wear resistance which is insufficient for industrial applications which require long tool operating lifetimes, particularly given the high cost of diamond materials and tool parts. In addition, the high wear rate of the poor quality nucleation face of the polycrystalline CVD diamond material can lead to a relatively rapid change in the quality of surface finishing which is achieved during use. As such, if the nucleation face of polycrystalline CVD diamond material is to be used as the working surface 4 then it is important to ensure that poor quality nucleation material having a high sp2 carbon and a low wear resistance is removed during fabrication of the polycrystalline CVD synthetic diamond work piece 2.

Raman spectroscopy has been found to be a particularly useful technique for measuring sp2 carbon content in localized regions. Raman spectroscopy will typically use a 500 nm-1000 nm light wavelength which, when focused on a surface of diamond, will sample a surface volume of approximately 1 µm$^3$. Non-diamond carbon peaks include: 1580 cm$^{-1}$—graphite; 1350-1580 cm$^{-1}$—nanocrystallite graphite; and 1550-1500 cm$^{-1}$—amorphous carbon and graphitic phases. It has been found that if non-sp3 bonded carbon is evident to any significant extent in a Raman spectrum of a synthetic diamond material then the material will have poorer wear resistance. Accordingly, preferably the sp2 carbon content is sufficiently low as to not exhibit any significant non-diamond carbon peaks in a Raman spectrum of the material.

The sp3 diamond Raman peak resides at approximately 1332 cm$^{-1}$. The width of the sp3 diamond Raman peak is known to be indicative of the crystal quality of the diamond material. According to certain embodiments, a Raman signal generated by a laser focused on a region of the working surface 4 exhibits an sp3 carbon peak at 1332 cm$^{-1}$ having a full width half-maximum of no more than 8.0 cm$^{-1}$, 7.0 cm$^{-1}$, 6.0 cm$^{-1}$, 5.0 cm$^{-1}$, 4.0 cm$^{-1}$, 3.0 cm$^{-1}$, 2.5 cm$^{-1}$, or 2.0 cm$^{-1}$. While such Raman signal parameters have previously been achieved in working surfaces formed from the growth face of polycrystalline CVD diamond material, embodiments of the present invention provide such parameters in a working surface formed from a processed nucleation surface of polycrystalline CVD diamond material comprising a small granular structure better suited to achieving very high quality machined surface finishes.

According to certain embodiments, using a helium-neon laser (633 nm) as the Raman excitation source focused on a region of the working surface 4 produces a diamond Raman spectrum with an sp2 carbon peak at around 1550 cm$^{-1}$ which is no more than 20%, 10%, 5%, 1%, 0.1%, 0.01%, or 0.001% of the height of the sp3 diamond Raman peak residing at around 1332 cm$^{-1}$ after background subtraction. The amount of sp2 carbon may alternatively be assessed by measuring the height of the sp3 diamond Raman peak residing at approximately 1332 cm$^{-1}$ relative to the height of the local background to that peak which is due to impurities such as sp2 carbon. According to certain embodiments, using a Raman excitation source at 785 nm focused on a region of the working surface 4 produces a diamond Raman spectrum with an sp3 carbon peak at approximately 1332 cm$^{-1}$ which is no less than 10%, 20%, 30%, 40%, 50%, 60%, or 70% of the local background intensity in the Raman spectrum. Again, while such Raman signal parameters have previously been achieved in working surfaces formed from the growth face of polycrystalline CVD diamond material, embodiments of the present invention provide such parameters in a working surface formed from a processed nucleation surface of polycrystalline CVD diamond material comprising a small granular structure better suited to achieving very high quality machined surface finishes. Certain embodiments may meet all three of the Raman measurement parameters as outlined above.

In addition to the characteristics of the working surface as described above, the polycrystalline CVD synthetic diamond work piece may be fabricated to have relatively large dimensions, both in terms of thickness and length.

A relatively high thickness from working surface to the rear mounting surface is useful for a number of reasons: (i) it provides bulk polycrystalline CVD diamond material to support the working surface; (ii) it allows for significant wear of the working surface while still maintaining a geometry and integrity for further use extending lifetime; (iii) it allows the work piece to be fabricated into a larger range of geometries; and (iv) growth of thicker polycrystalline CVD diamond material can results in better inter-growth of larger micron scale diamond grains having an average lateral size of no less than 10 µm providing further mechanical support for the working surface. For example, a thickness from the working surface to the rear mounting surface may be no less than 200 µm, 400 µm, 600 µm, 800 µm, 1 mm, 1.5 mm, or 2 mm. The precise thickness will depend on the specific application and its requirements in terms of tool geometry, mechanical strength, and lifetime.

By providing a well inter-grown micron scale polycrystalline CVD synthetic diamond work piece as described above, it is possible to achieve a robust work piece with a relatively high tensile rupture strength. For example, the work piece may have a tensile rupture strength with the working surface in tension of: ≥760 MPa×n for a thickness of 200 to 500 µm; ≥700 MPa×n for a thickness of 500 to 750 µm; ≥650 MPa×n for a thickness of 750 to 1000 µm; ≥600 MPa×n for a thickness of 1000 to 1250 µm; ≥550 MPa×n for a thickness of 1250 to 1500 µm; ≥500 MPa×n for a thickness of 1500 to 1750 µm; ≥450 MPa×n for a thickness of 1750 to 2000 µm; or ≥400 MPa×n for a thickness of ≥2000 µm, wherein multiplying factor n is 1.0, 1.1, 1.2, 1.4, 1.6, 1.8, or 2. Furthermore, the work piece may have a tensile rupture strength with the rear mounting surface in tension of: ≥330 MPa×n for a thickness of 200 to 500 µm; ≥300 MPa×n for a thickness of 500 to 750 µm; ≥275 MPa×n for a thickness of 750 to 1000 µm; ≥250 MPa×n for a thickness of 1000 to 1250 µm; ≥225 MPa×n for a thickness of 1250 to 1500 µm; ≥200 MPa×n for a thickness of 1500 to 1750 µm; ≥175 MPa×n for a thickness of 1750 to 2000 µm; or ≥150 MPa×n for a thickness of ≥2000 µm, wherein multiplying factor n is 1.0 1.1, 1.2, 1.4, 1.6, 1.8, or 2.

In addition to thickness and robustness as described above, a relatively large working surface, at least in one dimension, is required for certain applications and embodiments of this invention are particularly suited to applications where a very high quality machined surface finish is required approaching that achievable using a single crystal diamond tool but also when the size of the working surface is larger than that which is readily available in single crystal diamond form, at least at reasonable cost. As such, the working surface of the polycrystalline CVD diamond work piece may have at least one linear dimension of at least 6 mm, 8 mm, 10 mm, 12 mm, 15 mm, 20 mm, 30 mm, or 50 mm. Such dimensions are readily achievable using polycrystalline CVD diamond material.

Further still, during fabrication the polycrystalline CVD synthetic diamond work piece may be processed to have a well-defined, flat, smooth, working surface which is advantageous for achieving a very high quality machined surface finish. For example, the working surface may have a surface flatness as defined by a peak to valley deviation from a desired form of ≤5 µm, ≤4 µm, ≤3 µm, ≤2 µm, ≤1 µm, ≤0.5 µm, ≤0.2 µm, ≤or 0.1 µm and/or a surface roughness $R_a \leq 20$ nm, ≤10 nm, ≤5 nm, ≤2 nm, or ≤1 nm. The term "surface roughness $R_a$" (sometimes referred to as "centre line average" or "c.l.a.") refers to the arithmetic mean of the absolute deviation of surface profile from the mean line measured, for example, by stylus profilometer over a length of 0.08 mm according to British Standard BS 1134 Part 1 and Part 2.

It is envisaged that polycrystalline CVD synthetic diamond work pieces as described above may be used in a range of mechanical tool applications. For example, the polycrystalline CVD synthetic diamond work piece may be in the form of a wear part, a dresser, a wire drawing die, a gauge stone, or a cutter. A particularly preferred application is for high precision metal machining, e.g. aluminium machining. In such cases, the polycrystalline CVD synthetic diamond work piece may comprise a cutting edge 8 and a working surface 4 extending, for example in a perpendicular direction, from the cutting edge as illustrated in FIG. 1.

Figure 2:
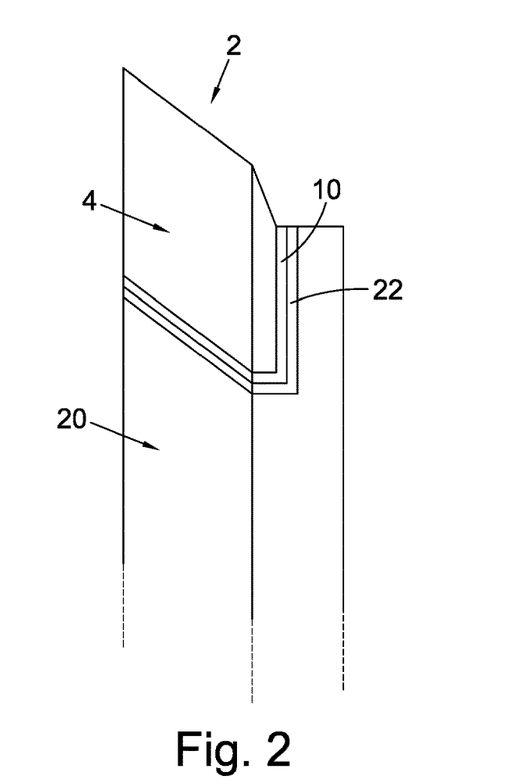
FIG. 2 illustrates a polycrystalline CVD synthetic diamond tool comprising a polycrystalline CVD synthetic diamond work piece mounted to a holder.

In such tool applications a polycrystalline CVD synthetic diamond work piece 2 as described above is mounted to a holder 20 as illustrated in FIG. 2. The specific mounting configuration will depend on the particular application but typically diamond tools are mounted in metal or metal carbide holders. Regardless of the specific geometry of the tool piece, a key feature is that the polycrystalline CVD synthetic diamond work piece 2 is oriented such that the working surface 4 of the polycrystalline CVD synthetic diamond work piece 2 as previously defined is exposed to form a working surface of the polycrystalline CVD synthetic diamond tool.

The polycrystalline CVD synthetic diamond work piece 2 may be mounted to the holder via, for example, a metal braze bond 22. As previously described, a rear mounting surface of the polycrystalline CVD synthetic diamond work piece 2 may be provided with a metallization coating 10 to allow good adhesion of the metal braze. The metallization coating may comprise a carbide forming metal such as titanium which adherers to the diamond surface. A further bonding layer, such as gold, may be provided over the carbide forming layer to achieve good adhesion with typical metal braze bonds. An inert barrier layer, such as platinum, may be provided between the carbide forming layer and the bonding layer to prevent adverse reactions between the titanium and the gold layers at high temperatures in use. The braze join to the holder may comprise gold or alternatively may comprise copper and silver. Other alternatives are also known in the art.

Figure 3:
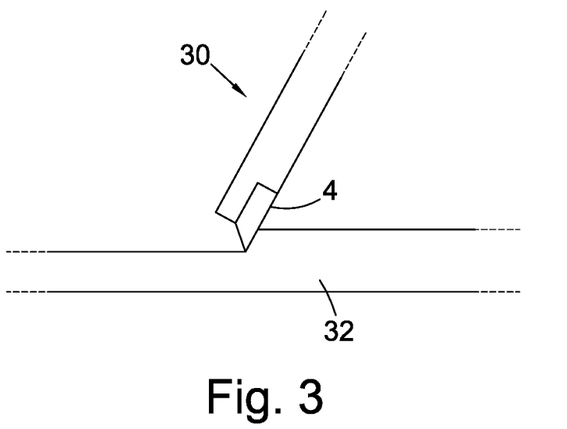
FIG. 3 illustrates a method of processing a material using a polycrystalline CVD synthetic diamond tool.

FIG. 3 illustrates a method of processing a material using a polycrystalline CVD synthetic diamond tool as described above. The method comprises orienting the polycrystalline CVD synthetic diamond tool 30 such that the working surface 4 is in contact with the material 32 which is to be processed. Processing of the material is then achieved by providing relative movement of the material 32 and the working surface 4 of the polycrystalline CVD synthetic diamond tool 30 while the working surface of the polycrystalline CVD synthetic diamond tool is in contact with the material being processed. This relative movement may be achieved by moving the material 32, by moving the polycrystalline CVD synthetic diamond tool 30, or by moving both the material and tool. In any of these cases, an important feature is that the working surface of the polycrystalline CVD synthetic diamond tool which contacts and processes the material being processed is as defined herein. Usually, the working surface of the polycrystalline CVD synthetic diamond tool is pressed against the material to be processed with a significant force which will be dependent on the geometry of the tool, the type of material being processed, and the desired surface finish.

Figure 4:
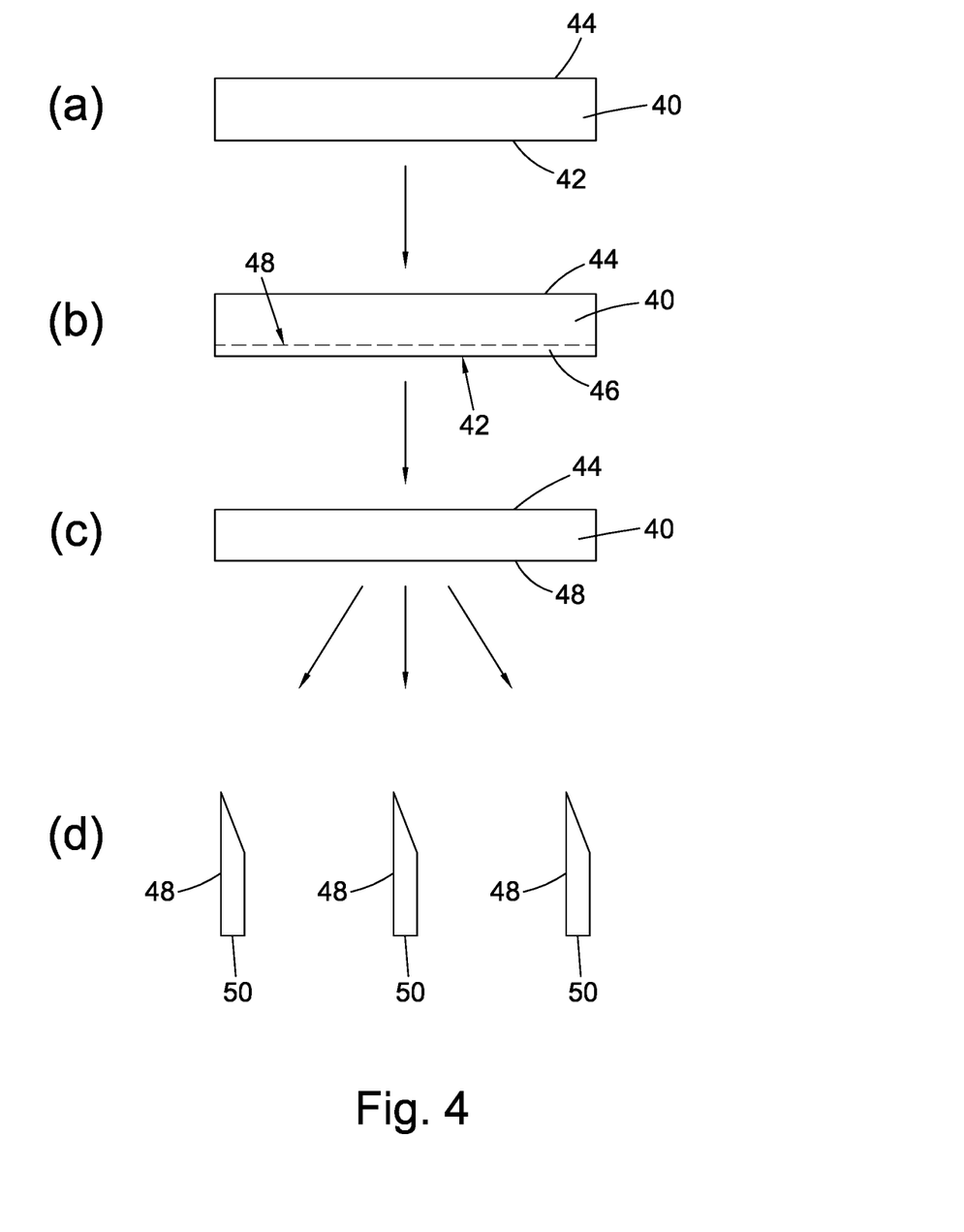
FIG. 4 illustrates a method of fabricating a plurality of polycrystalline CVD synthetic diamond work pieces.

FIG. 4 illustrates a method of fabricating a plurality of polycrystalline CVD synthetic diamond work pieces as previously described. The method comprises:

starting with a layer of polycrystalline CVD synthetic diamond material 40 as shown in FIG. 4(a) having a nucleation face 42 and a growth face 44, the nucleation face comprising smaller grains than the growth face, wherein the average lateral grain size of the growth face is no less than 10 µm;

processing the nucleation face 42 of the layer of polycrystalline CVD synthetic diamond material 40 as shown in FIG. 4(b) to remove a portion 46 of the polycrystalline CVD synthetic diamond material from the nucleation face, said portion having a depth of between 50 nm and 30 µm, to form a processed nucleation surface 48 as shown in FIG. 4(c) which has:

(a) smaller diamond grains than the growth face;
(b) an average lateral grain size in a range 10 nm to 15 µm; and
(c) a Raman signal generated by a laser focused on the processed nucleation surface which exhibits one or more of the following characteristics:
  (1) an sp3 carbon peak at 1332 $cm^{-1}$ having a full width half-maximum of no more than 8.0 $cm^{-1}$,
  (2) an sp2 carbon peak at 1550 $cm^{-1}$ having a height which is no more than 20% of a height of an sp3 carbon peak at 1332 $cm^{-1}$ after background subtraction when using a Raman excitation source at 633 nm; and (3) an sp3 carbon peak at 1332 cm$^{-1}$ is no less than 10% of local background intensity in a Raman spectrum using a Raman excitation source at 785 nm, and cutting the layer of polycrystalline CVD synthetic diamond material 40 as shown in FIG. 4(d) to form a plurality of polycrystalline CVD synthetic diamond work pieces 50 such that a working surface of each of the polycrystalline CVD synthetic diamond work pieces 50 is formed of said processed nucleation surface 48.

The layer of polycrystalline CVD synthetic diamond material may be in the form of a free-standing wafer or may be in the form of a layer of polycrystalline CVD synthetic diamond material disposed on a support substrate with the nucleation face exposed and the growth face bonded to the support substrate. The polycrystalline CVD synthetic diamond work pieces will therefore either be in the form of a freestanding piece of polycrystalline CVD synthetic diamond material or in the form of a layer of polycrystalline CVD synthetic diamond material disposed on a support substrate with the working surface exposed and a rear mounting surface bonded to the support substrate.

Suitable free-standing wafers of polycrystalline CVD synthetic diamond material used as the starting point for embodiments of this invention are available from Element Six Limited. A variety of grades of polycrystalline CVD synthetic diamond material are available including mechanical grades, thermal grades, and optical grades. While mechanical grades are suitable for use in embodiments of the present invention, the present inventors have noted that many different grades of polycrystalline CVD diamond material may share a similar grain structure and size at and near the nucleation surface. As such, the grade of polycrystalline CVD diamond material used in embodiments of the present invention may not be limited to those previously identified as mechanical grades. For example, it is also envisaged that higher thermal conductivity grades, which have typically been shown to perform poorly in abrasives/mechanical testing, may be useful in certain embodiments of the present invention to achieve a very high quality machined surface finish as the higher thermal conductivity of such polycrystalline CVD diamond grades will result in a lower local tool tip temperature. As such, optionally the thermal conductivity of the polycrystalline CVD diamond material may be no less than 1000 Wm$^{-1}$K$^{-1}$, 1200 Wm$^{-1}$K$^{-1}$, 1400 Wm$^{-1}$K$^{-1}$, 1600 Wm$^{-1}$K$^{-1}$, 1800 Wm$^{-1}$K$^{-1}$, 1900 Wm$^{-1}$K$^{-1}$, 2000 Wm$^{-1}$K$^{-1}$, 2100 Wm$^{-1}$K$^{-1}$, or 2200 Wm$^{-1}$K$^{-1}$.

Having regard to the nucleation face processing step, lower quality nucleation diamond material is removed by processing the surface to a depth in a range 50 nm and 30 μm. If this processing step is too shallow then poor quality nucleation diamond material may remain on the surface which will ultimately form the working surface of the diamond tool piece leading to poor performance and tool lifetime. As previously described, Raman spectroscopy can be used to measure the quality of the diamond material of the processed nucleation surface to ensure that very little sp2 carbon remains at the surface which will for the working surface of the diamond work piece. Conversely, if the processing step is too deep then the average lateral grain size of the diamond grains which will ultimately form the working surface of the diamond work piece becomes too large and a very high quality machined surface finish is not possible. SEM analysis can be used to ensure that the correct granular surface structure is achieved. As such, the present inventors have found that there is an optimum depth range which allows the removal of poor quality nucleation diamond material while also retaining a surface which has a suitable grain size to achieve a very high quality machined surface finish.

Within the aforementioned depth range, the specific depth to which the nucleation face is processed will depend to some extent on the particular application and the desired granular structure for that particular application. For example, the depth of the portion of the polycrystalline CVD synthetic diamond material removed from the nucleation face may be no more than 20 μm, 15 μm, 10 μm, or 5 μm and/or no less than 100 nm, 200 nm, 300 nm, 500 nm, or 1 μm.

Suitable surface processing steps for removing a portion of the nucleation face of the polycrystalline CVD diamond material to a desired depth are known in the art and include one or more of the following:

mechanical lapping and polishing techniques;
chemical techniques include etching techniques such as plasma etching using suitable gas chemistries including, for example, one or more of hydrogen, oxygen, argon (or other inert gases), and chlorine (or other halides)—an example of an etching technique for achieving low surface roughness diamond surface finishes is described in WO2008/090511;
chemo-mechanical processing (CMP) techniques which combine mechanical and chemical processing mechanisms utilizing CMP slurries including abrasive grit particles and chemical components which react with the surface of the super-hard material being processed to change the chemical composition of the surface making it easier to remove—such processes having being utilized for other materials and are now currently under development for super-hard materials such as those comprising diamond;
laser beam cutting/ablating—laser cutting is the industry standard for cutting of synthetic diamond products;
high energy particle beam cutting/ablating—electron beam cutting has been proposed for cutting diamond products in the past and has recently been adapted to cut super-hard materials at significantly faster rates when compared with laser cutting;
electric discharge machining (EDM)—this technique is useful for cutting electrically conductive super-hard materials such as boron doped diamond materials; and
focussed ion beam (FIB) surface processing—this technique is known in the art for processing super-hard materials such as diamond.

Ideally, a processing method that imparts very little subsurface damage should be used to remove the desired amount in a controlled and uniform manner. Such a technique may include polishing with a fine grade polishing wheel or a CMP processes. The growth surface of the polycrystalline CVD diamond wafer is also generally processed to provide a smooth, flat reference surface for mounting the diamond work pieces.

In addition, or even as an alternative, to removal of nucleation surface material as described above, it is also possible to control early stage growth of the polycrystalline CVD diamond material to reduce sp2 carbon content of the nucleation surface material and achieve a working surface which has the above described combination of low grain size and low sp2 content. For example, the polycrystalline CVD diamond material may be grown using a methodology which comprises:

providing a substrate;

seeding a surface of said substrate;

growing a diamond nucleation layer on said surface using a chemical vapour deposition (CVD) technique; and growing a thicker layer of polycrystalline CVD diamond material over the diamond nucleation layer, wherein the method further comprises applying at least one of the following techniques:

(a) using a nanocrystalline diamond powder for the seeding step, the nanocrystalline diamond powder having an average particle size of no more than 200 nm and a D90 particle size of no more than 500 nm thereby reducing the size of grooves formed in the substrate surface and consequently reducing void formation during diamond growth thereon when compared with a seeding process which utilizes larger seed particles;

(b) using alternating CVD diamond growth and non-diamond carbon etch steps to fabricate the diamond nucleation layer, the technique comprising growing a diamond layer of a first thickness by chemical vapor deposition, etching at least a part of said diamond layer, repeating said steps of growing and etching at least a part of said diamond layer until an overall thickness of said diamond layer reaches a second thickness, wherein said step of etching at least a part of said diamond layer etches non-diamond phases preferentially over diamond phases thereby increasing the proportion of diamond phase in the diamond nucleation layer relative to non-diamond phases;

(c) using a pre-growth etching step applied to the substrate surface after seeding and prior to growth of the diamond nucleation layer thereon, wherein crystalline seeds are deposited on the substrate surface during seeding and the pre-growth etching step comprises etching using a chemistry which is selected to etch the substrate surface preferentially over crystalline seeds on the substrate surface and to smooth the substrate surface thereby reducing nucleation sites formed by sharp groove edges on the substrate surface relative to nucleation sites provided by the crystalline seeds.

The aforementioned techniques involve: increasing nucleation densities and reducing grooves in the substrate using fine nanoparticle seeding to reduce void formation and non-diamond carbon phases; using an alternating growth and etching procedure during early stage growth to reduce non-diamond carbon and increase grain size; and using a pre-growth etch selected to reduce nucleation on the substrate surface relative to the seeds to increase crystal domains and consequently diamond grain size during early stage growth. Advantageously these techniques can be used in combination with either two or all three techniques being applied together. For example, while a nanocrystalline powder can increase nucleation densities, reduce void formation and non-diamond carbon, and thus increasing thermal conductivity, if the nucleation density is too high then the crystal domain size can be reduced resulting in more grain boundaries which will reduce thermal conductivity. As such, techniques (a) and (c) may be applied in combination to allow a high but controlled nucleation to be provided allowing optimization of nucleation density versus crystal domain size while also lowering void formation, non-diamond carbon, and other defects. Technique (b) may then be used to further reduce the amount of non-diamond carbon during the early stages of polycrystalline CVD diamond growth and reduce the thickness of the nucleation layer before moving into a higher quality bulk polycrystalline CVD diamond growth phase.

After growth and processing of a wafer of polycrystalline CVD diamond material as described above, the wafer is cut into a plurality of diamond work pieces. Cutting will typically be performed using a laser although other cutting methods such as e-beam cutting may be utilized. In certain embodiments, the diamond work pieces may be further surface processed after cutting. For example, edge preparation may be completed using standard fine grinding techniques. The edge quality and lifetime of the diamond tool may be further enhanced by using processes that impart less surface and sub-surface damage such as laser shaping processes.

Another synthesis method for achieving the polycrystalline CVD diamond work pieces as described herein may be used which avoids the need for post-synthesis processing of the nucleation face of the as-grown polycrystalline CVD diamond material. Such a method may utilize a very flat, low surface roughness growth substrate and careful control of early stage diamond growth using seeding and early stage diamond growth techniques such as those described above to achieve good quality nucleation face diamond material. In this case, the nucleation face of the as-grown polycrystalline CVD diamond material may be sufficiently well formed that surface processing of the nucleation face is not required after removal of the growth substrate.

For example, the growth substrate may have a surface flatness as measured over a length of 5 mm across the growth substrate of ≤5 µm, ≤4 µm, ≤3 µm, ≤2 µm, ≤1 µm, ≤0.5 µm, ≤0.2 µm, ≤or 0.1 µm. Furthermore, the growth substrate may have a surface roughness $R_a$≤20 nm, ≤10 nm, ≤5 nm, ≤2 nm, or ≤1 nm. Such a growth substrate may be formed, for example, of a carbide forming refractory metal substrate such as tungsten or a silicon wafer. The growth surface of the growth substrate is processed to a high degree of flatness and low surface roughness prior to diamond growth thereon. When used in combination with the seeding and early stage diamond growth processes as described previously a low sp2 diamond nucleation face can be achieved having a high degree of flatness and a low surface roughness. As such, another method of fabricating a plurality of polycrystalline CVD synthetic diamond work pieces as described herein is provided, the method comprising:

growing a layer of polycrystalline CVD synthetic diamond material on a growth substrate, the layer of polycrystalline CVD synthetic diamond material having a nucleation face and a growth face, the nucleation face comprising smaller grains than the growth face, wherein the average lateral grain size of the growth face is no less than 10 µm;

wherein the growth substrate has a surface flatness ≤5 µm as measured over a length of 5 mm across the growth substrate and a surface roughness $R_a$≤20 nm;

wherein growth of the polycrystalline CVD synthetic diamond material is controlled such that after removal of the growth substrate the nucleation face of the layer of polycrystalline CVD synthetic diamond material has:

(a) smaller diamond grains than the growth face;

(b) an average lateral grain size in a range 10 nm to 15 µm; and (c) a Raman signal generated by a laser focused on the processed nucleation surface which exhibits one or more of the following characteristics:

(1) an sp3 carbon peak at 1332 cm$^{-1}$ having a full width half-maximum of no more than 8.0 cm$^{-1}$, (2) an sp2 carbon peak at 1550 cm$^{-1}$ having a height which is no more than 20% of a height of an sp3 carbon peak at 1332 cm$^{-1}$ after background subtraction when using a Raman excitation source at 633 nm; and (3) an sp3 carbon peak at 1332 cm$^{-1}$ is no less than 10% of local background intensity in a Raman spectrum using a Raman excitation source at 785 nm, and cutting the layer of polycrystalline CVD synthetic diamond material to form a plurality of polycrystalline CVD synthetic diamond work pieces such that a working surface of each of the polycrystalline CVD synthetic diamond work pieces is formed of said nucleation face.

In summary, embodiments of this invention utilize the anisotropic material properties of polycrystalline CVD diamond material in combination with careful growth and/or processing control to provide a diamond tool capable of very high quality machined surface finishing. Embodiments of the present invention complement single crystal diamond tools in aluminium and other material machining applications and also provide a solution for applications requiring long edge length tools capable of achieving very high quality machined surface finishing.

While this invention has been particularly shown and described with reference to embodiments, it will be understood to those skilled in the art that various changes in form and detail may be made without departing from the scope of the invention as defined by the appendant claims.

The invention claimed is:

1. A polycrystalline CVD synthetic diamond work piece for use in a polycrystalline CVD synthetic diamond tool, the polycrystalline CVD synthetic diamond work piece comprising:
   a working surface;
   and a rear mounting surface;
   wherein an average lateral grain size of the rear mounting surface is no less than 10 μm, and
   wherein the working surface comprises:
   (a) smaller diamond grains than the rear mounting surface;
   (b) an average lateral grain size in a range 10 nm to 15 μm; and
   (c) a Raman signal generated by a laser focused on the working surface which exhibits both of the following characteristics:
   (1) an sp3 carbon peak at 1332 cm$^{-1}$ having a full width half-maximum of no more than 8.0 cm$^{-1}$; and
   (2) an sp2 carbon peak at 1550 cm$^{-1}$ having a height which is no more than 20% of a height of an sp3 carbon peak at 1332 cm$^{-1}$ after background subtraction when using a Raman excitation source at 633 nm.

2. A polycrystalline CVD synthetic diamond work piece according to claim 1, wherein the average lateral grain size of the working surface is no less than 20 nm.

3. A polycrystalline CVD synthetic diamond work piece according to claim 1, wherein the average lateral grain size of the working surface is no more than 12 μm.

4. A polycrystalline CVD synthetic diamond work piece according to claim 1, wherein the average lateral grain size of the rear mounting surface is no less than 12 μm.

5. A polycrystalline CVD synthetic diamond work piece according to claim 1, wherein the full width half-maximum of the sp3 carbon peak at 1332 cm$^{-1}$ for the working surface is no more than 7.0 cm$^{-1}$.

6. A polycrystalline CVD synthetic diamond work piece according to claim 1, wherein the sp2 carbon peak at 1550 cm$^{-1}$ for the working surface is no more than 10% of the height of the sp3 carbon peak at 1332 cm$^{-1}$ after background subtraction when using the Raman excitation source at 633 nm.

7. A polycrystalline CVD synthetic diamond work piece according to claim 1, wherein a thickness from the working surface to the rear mounting surface is no less than 200 μm.

8. A polycrystalline CVD synthetic diamond work piece according to claim 1, wherein the working surface has at least one linear dimension of at least 6 mm.

9. A polycrystalline CVD synthetic diamond work piece according to claim 1, wherein the polycrystalline CVD synthetic diamond work piece is in the form of: a wear part; a dresser; a wire drawing die; a gauge stone; or a cutter.

10. A polycrystalline CVD synthetic diamond work piece according to claim 1, wherein the polycrystalline CVD synthetic diamond work piece comprises a cutting edge and the working surface extends from the cutting edge.

11. A polycrystalline CVD synthetic diamond work piece according to claim 1, wherein the working surface has a surface flatness ≤5 μm.

12. A polycrystalline CVD synthetic diamond work piece according to claim 1, wherein the working surface has a surface roughness $R_a$≤20 nm.

13. A polycrystalline CVD synthetic diamond tool comprising:
   a polycrystalline CVD synthetic diamond work piece according to claim 1; and
   a holder to which the polycrystalline CVD synthetic diamond work piece is mounted,
   wherein the polycrystalline CVD synthetic diamond work piece is oriented such that the working surface of the polycrystalline CVD synthetic diamond work piece is exposed to form a working surface of the polycrystalline CVD synthetic diamond tool.

14. A method of processing a material using a polycrystalline CVD synthetic diamond tool according to claim 13, the method comprising:
   orienting the polycrystalline CVD synthetic diamond tool such that the working surface thereof is in contact with the material to be processed; and
   processing the material by providing relative movement of the material and the working surface of the polycrystalline CVD synthetic diamond tool while the working surface of the polycrystalline CVD synthetic diamond tool is in contact with the material being processed.

* * * * *